United States Patent [19]

Wittrock

[11] 4,160,211
[45] Jul. 3, 1979

[54] METHOD AND INSTRUMENT FOR MEASURING THE SENSITIVITY OF A RADIO RECEIVER

[75] Inventor: Glen R. Wittrock, Sioux Falls, S. Dak.

[73] Assignee: Sencore, Inc., Sioux Falls, S. Dak.

[21] Appl. No.: 831,513

[22] Filed: Sep. 8, 1977

[51] Int. Cl.² .............................................. H04B 17/00
[52] U.S. Cl. ..................................... 325/363; 325/67; 324/57 N
[58] Field of Search ............... 325/363, 67; 324/57 N; 328/146, 148, 162

[56] References Cited

U.S. PATENT DOCUMENTS

| 2,959,672 | 11/1960 | LaHaise | 325/363 |
| 3,821,648 | 6/1974 | Campbell | 325/363 |

Primary Examiner—Robert L. Griffin
Assistant Examiner—Alexander Gerasimow
Attorney, Agent, or Firm—Edmond T. Patnaude

[57] ABSTRACT

An RF carrier applied to the antenna input of a radio receiver under test is sequentially modulated with an audio signal to provide sequentially at the audio output of the receiver a signal plus noise signal and a noise signal, which audio output signals are compared to provide a ratio voltage which is displayed to permit adjustment of the level of the RF carrier to set said ratio at a predetermined value.

2 Claims, 4 Drawing Figures

METHOD AND INSTRUMENT FOR MEASURING THE SENSITIVITY OF A RADIO RECEIVER

The present invention relates in general to the testing of radio receivers, and it relates in particular to a new and improved method and instrument for measuring the sensitivity of a radio receiver.

While the present invention is described as a separate instrument it will be understood by those skilled in the art that the method and circuits disclosed herein may be readily incorporated into instruments used for performing other tests.

BACKGROUND OF THE INVENTION

The audio output of a radio receiver inherently includes noise components which are generated within the receiver itself and which impair the ability of the receiver to satisfactorily reproduce the audio components of the received signals. The ability of a radio receiver to pick up weak signals is known in the art as "sensitivity" and is inversely related to the amplitude of this internally produced noise. The standard definition of sensitivity as specified by the Electronic Industry Association is that level of the radio frequency input to the receiver, expressed in microvolts, required to produce a signal-plus-noise to noise ratio of 10 db at the audio output of the receiver, the signal plus noise level being provided when the RF input is modulated with a 1000 Hz tone at 30% modulation and the noise level being provided when the RF input is unmodulated. The test which has heretofor been prescribed for measuring the sensitivity of a radio receiver is both complicated and time consuming and requires a considerable degree of skill.

In carrying out the standard sensitivity test the technician first meters the audio output signal while the audio modulated radio frequency signal is applied to the antenna input of the receiver. Then the audio modulation is removed from the radio frequency input signal and the audio output signal is again measured. The ratio in decibels of these two measurements must then be calculated. If the ratio is ten db the technician then measures the radio frequency input level in microvolts to provide the sensitivity number of the receiver under test. If, however, the ratio is not ten db, and ordinarily it is not, the technician must then adjust the RF level to what he estimates from experience will produce a ratio of ten db and repeats the test.

SUMMARY OF THE INVENTION

Briefly, in accordance with the broader aspects of the present invention there is provided a method and instrument which greatly facilitate the measurement of the sensitivity of a radio receiver. When using this method the technician simply connects appropriate terminals of the instrument to the audio output of the receiver and then adjusts an RF level control on the instrument until the displayed signal-plus-noise to noise ratio is ten db. The RF level control actuator is calibrated in microvolts wherefor the receiver sensitivity is directly readable from this control.

The instrument itself includes a ratio detecting and display circuit which displays the ratio in decibels of the amplitudes of the two audio signals respectively applied to its inputs. A sequencer controls the sequential application of modulated and unmodulated bursts of RF to the antenna inputs of the receiver and synchronizes the gating of the resulting audio output signals to the two inputs of the ratio detecting and display circuit so that one input receives the audio output during the occurrence of the modulated RF input and the other input receives the audio output during the occurrence of the unmodulated RF input.

GENERAL DESCRIPTION OF THE DRAWINGS

DETAILED DESCRIPTION OF THE INVENTION

Figure 1:
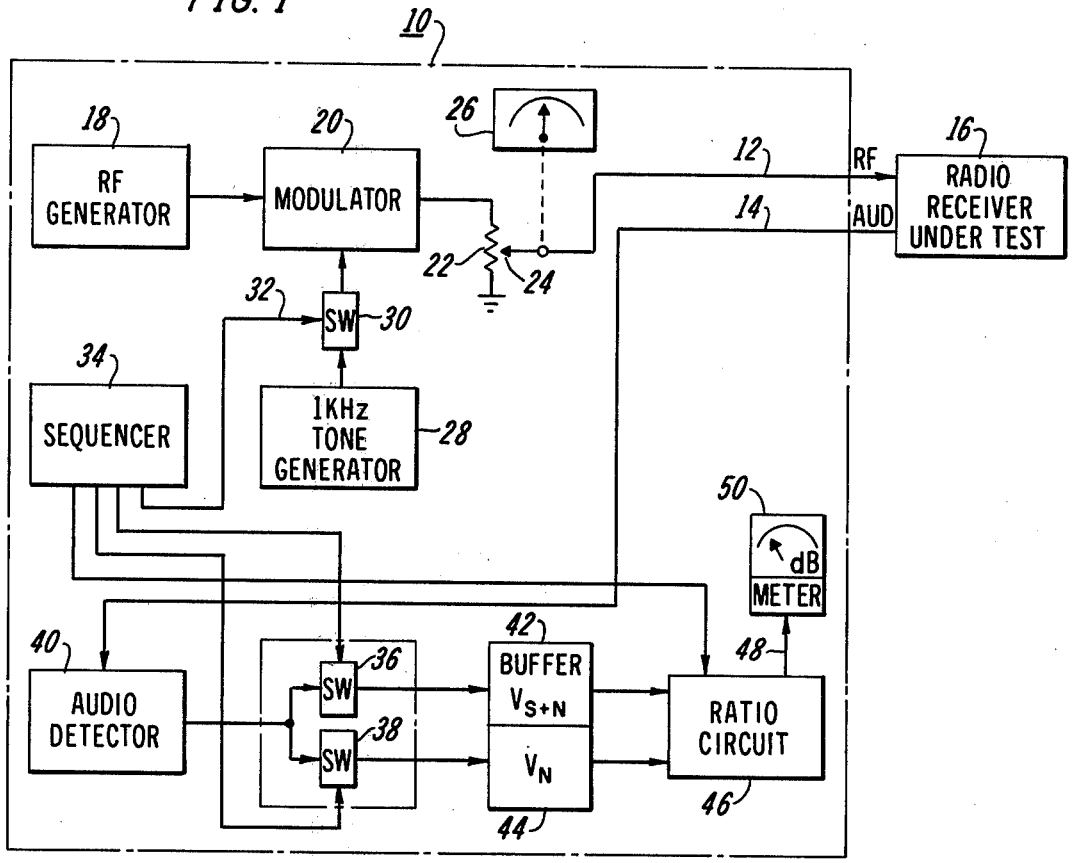
FIG. 1 is a block diagram of an instrument for measuring the sensitivity of a radio receiver.

With particular reference to FIG. 1, a radio receiver sensitivity measuring instrument 10 includes a pair of leads 12 and 14 which are adapted to be respectively connected to the RF input and audio output terminals of a radio receiver 16 under test. Ordinarily the RF input terminal is the antenna terminal and the audio output terminal may, for example, be an external speaker system jack or an internal connection to the output of the audio amplifier.

The instrument 10 comprises an RF generator 18 for providing a radio frequency carrier signal. This RF signal is applied to a modulator 20 where it is periodically modulated with a constant frequency audio tone of, for example, 1000 Hz. The output signal from the modulator 20 is coupled to an RF level control potentiometer 22 having an adjustable wiper 24 connected to the lead 12. An adjustment knob or the like for the potentiometer 24 is provided with a visible readout, as shown schematically at 26, for indicating the voltage level in microvolts of the RF signal applied to the RF input of the receiver under test. Where the adjustment device is a rotatable knob and the potentiometer 22 is a step attenuator the readout 26 may simply be a graduated dial on a vernier adjustment. If desired, a voltmeter could be connected between the wiper 24 and ground to indicate the RF level applied to the receiver. In any case, as this description proceeds it will be apparent that the sensitivity of the receiver 16 is read directly from the readout 26 without any calculation or the like being required.

In order to periodically modulate the RF signal with an audio tone of constant frequency, the output of a fixed frequency audio oscillator 28 is connected through a switch 30 to the modulating input of the modulator 20. Preferably the switch 30 is a solid state switch which becomes conductive in response to a voltage at its control terminal 32.

A sequencer 34 applies periodic control pulses to the switch 30 to provide periodic bursts of audio modulated RF at the output of the modulator 20. The sequencer 34 also applies control pulses to the control terminals of a pair of solid state switches 36 and 38 in synchronized relationship with the bursts of modulated RF to the radio receiver. The lead 14 from the audio output of the receiver 16 couples the audio signal from the radio to an audio detector 40 whose output is a dc voltage connected to both of the switches 36 and 38.

The audio detector 40 provides a dc output voltage whose level varies with that of the audio signal applied thereto, and this dc voltage is averaged and stored in a pair of hold circuits 42 and 44. As more fully described hereinafter, the detector output is gated to the hold circuit 42 by the switch 36 while the modulated RF is being applied to the radio receiver 16, and the detector output is gated to the hold circuit 44 while the unmodulated RF is being applied to the radio receiver. Consequently, the voltage stored in the hold circuit 42 is proportional to the audio output when the audio modulated RF is being applied to the receiver, and the voltage stored in the hold circuit 44 is proportional to the audio output when the unmodulated RF is being applied to the receiver.

The two voltages from the hold circuits 42 and 44 are respectively supplied to two inputs of a ratio computing circuit 46 which provides at its output 48 a voltage proportioned to the ratio of the two inputs. The output 48 is connected to a voltmeter 50 which is calibrated to read directly in decibels. It may be seen that the ratio computing circuit 46 is also under control of the sequencer 34.

As thus far described it may be seen that the sensitivity of the radio receiver 16 may be measured in accordance with the present invention simply by adjusting the RF attenuating potentiometer 22 until the meter 50 reads ten db. The readout 26 will then show the sensitivity of the receiver. The sensitivity test which has heretofore been both tedious and difficult can now be performed quickly and accurately with a minimum degree of skill.

Figure 4:
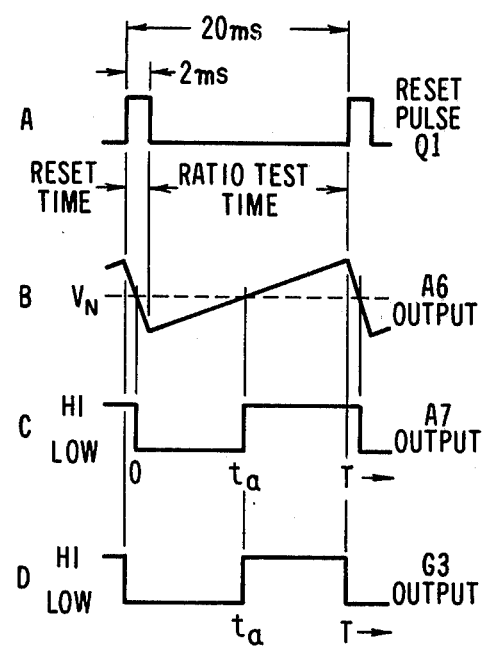
FIG. 4 is another group of waveforms useful in understanding the invention.
Figure 2:
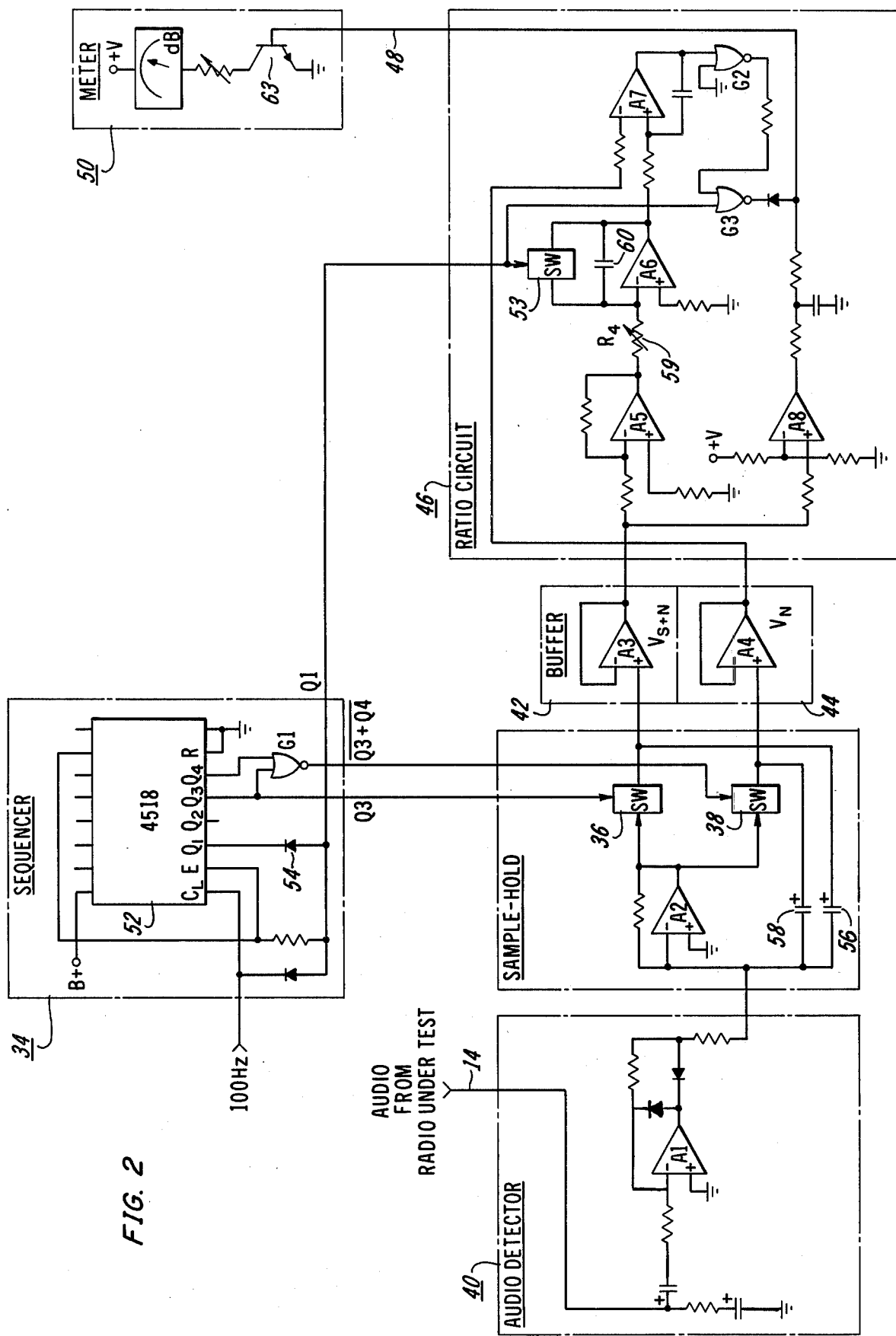
FIG. 2 is a schematic circuit diagram of the instrument of FIG. 1.

Referring now to FIG. 2 for a more detailed description of the circuitry used to carry out the present invention, the sequencer 34 may be seen to include a conventional solid state divider 52 providing a binary coded decimal output at the terminals $Q_1$, $Q_2$, $Q_3$, and $Q_4$. Timing pulses at a frequency of one-hundred Hz are applied to the clock input $C_L$. Pulses having a width of two milliseconds and occuring at a frequency of fifty Hz are coupled by a diode 54 from the $Q_1$ output to the control terminal of a switch 53 for resetting an integrator in the ratio circuit 46, so that the reading of the meter 50 is continuously updated. The waveform of this reset signal is shown in FIG. 4A.

Figure 3:
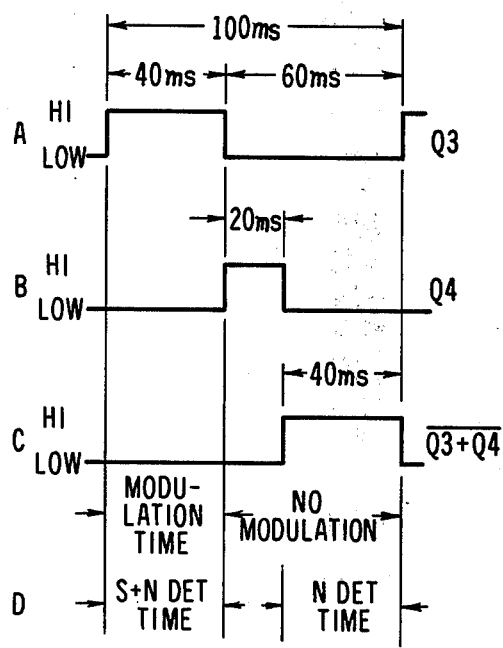
FIG. 3 is a group of waveforms which facilitate an understanding of the invention.

The signal appearing at the $Q_3$ output is shown in FIG. 3A and is connected to the control terminal of the switch 36. This $Q_3$ output signal and the $Q_4$ output signal as shown in FIG. 3B are applied to a NOR gate G1 whose output signal is shown in FIG. 3C and is applied to the control terminal of the switch 38. As shown in FIG. 3D it may thus be seen that the switch 36 is conductive for a period of forty milliseconds, followed by a period of twenty milliseconds when neither switch 36 nor switch 38 is conductive and then the switch 38 is conductive for a period of forty milliseconds. The purpose for the interim twenty millisecond delay before the switch 38 is gated on is to permit the circuits of the receiver to settle down after removal of the modulated RF signal from the RF input before the audio output is applied to the ratio circuit 46.

The audio detector 40 comprises an operational amplifier A1 connected as a precision rectifier to provide a dc output voltage whose amplitude closely follows the amplitude of the inverting input of an operational amplifier A2 forming a part of the hold circuit. It may be seen that the output of the amplifier A1 is also coupled to the switch 36 and a capacitor 56 is thus connected in a feedback loop of the amplifier A2 when the switch 36 is gated on by the sequencer 34. The output of the amplifier A2 is coupled to the switch 38 and a capacitor 58 is thus connected in a feedback loop of the amplifier A2 when the switch 38 is gated on by the sequencer. Accordingly, the voltage across the capacitor 56 is thus proportional to the average voltage of the rectified audio signal during the time the audio modulated RF signal is applied to the receiver and the voltage across the capacitor 58 is proportional to the average voltage of the rectified audio signal during the time the unmodulated RF signal is applied to the receiver.

The voltages on the capacitors 56 and 58 are respectively coupled by buffer amplifiers A3 and A4 to the ratio circuit 46. These two amplifiers prevent the capacitors 56 and 58 from discharging while the associated switches 36 and 38 are off and they also provide a low impedance drive for the ratio circuit 46.

The ratio circuit 46 provides an output voltage on the output lead 48 which is proportional to the ratio of the dc voltage levels on the capacitors 56 and 58. As shown, the signal plus noise voltage from the amplifier A3 is coupled to the inverting input of an operational amplifier A5 connected in the inverting mode, and the output of the amplifier A5 is connected to an integrator incorporating the operational amplifier A6. As shown in the waveform of FIG. 4B, the output of the amplifier A6 is a sawtooth or ramp wave. If the dc voltage input to the integrator is constant the slope of the sawtooth wave will also be constant, as shown in FIG. 4B, and is equal to $R_4C_{60}$. A variable resistor 59 connected between the output of the amplifier A5 and the input of the amplifier A6 provides a calibrating adjustment for adjusting the slope of the sawtooth wave. The voltage across the capacitor 60 connected in a feedback loop of the amplifier A6 is coupled to the non-inverting input of a comparator A7. The capacitor 60 is completely discharged by the switch 53 during the two millisecond duration of the reset pulse (FIG. 4A) from the sequencer 34.

The output voltage from the buffer A4 is connected to the inverting input of the comparator A7. It may thus be seen that whenever the voltage on the capacitor 60 is less than the voltage from the buffer A4 the output of the comparator will be LOW. When the output of the integrator A6 goes more positive than the voltage from the buffer A4 the output of the comparator switches HI. The output signal from the comparator A7 is shown in FIG. 4C.

With reference to FIGS. 4B and 4C it will be seen that the ramp voltage reaches the level $V_N$ (output voltage of A4) after a time interval of ta wherein:

$$ta = (V_N R_4 C_{60}/V_{S+N})$$

Accordingly the output of the comparator A7 has the following duty cycle:
$$(ta/T) = (V_N R_4 C_{60}/V_{S+N}T)$$

By maintaining the time between the reset pulses constant, the duty cycle of the voltage from the comparator A7 is equal to the ratio of the two input voltages $V_N$ and $V_{S+N}$.

The output voltage from the comparator A7 is coupled through a NOR gate G2 connected as an inverter to one input of a NOR gate G3 which functions as a second inverter in the absence of reset pulses from the $Q_1$ output of the sequencer. During occurrence of the reset pulses, the output of the gate G3 goes LOW, as shown in FIG. 4D, wherefor the reset time is continuously substracted from the real time condition in which the circuit operates.

The output signal from the gate G3 is applied to the base of a meter driver transistor 63 and being pulse width modulated is averaged by the meter and appears as a voltage proportional to the ratio of $V_{S+N}$ to $V_N$ detected voltages. The meter is calibrated to read DB.

In order to prevent the possibility of the ratio circuit attempting to calculate the ratio of zero to zero in the case of a no input condition, the ratio circuit 46 is designed to switch off the meter 50 as $V_{S+N}$ approaches zero. For this purpose an operational amplifier A8 connected as a comparator has a dc voltage of 100 mV applied to its inverting input and the output of the buffer A3 ($V_{S+N}$) is applied to its noninverting input. As a consequence, if $V_{S+N}$ is less than 100 mV the base of the transistor 63 is held negative and the transistor is prevented from conducting.

OPERATION

In order to measure the sensitivity of a radio receiver using the method and instrument of the present invention an RF signal applied to the receiver is periodically modulated with bursts of a constant frequency audio tone to provide at the audio output of the receiver alternate signals which are respectively proportional to the signal plus noise and noise characteristics of the audio output of the receiver.

The switch 30 is rendered conductive, i.e., turned on, when the $Q_3$ output of the sequencer 52 goes HI. Hence, the audio oscillator output is coupled to the modulator 20 for a period of forty milliseconds at the beginning of each one-hundred millisecond period. The $Q_3$ and $Q_4$ outputs from the sequencer 52 control the switches 36 and 38 so that the rectified audio output voltage is applied to the capacitor 56 during the initial forty millisecond period while the RF signal is audio modulated and is applied to the capacitor 58 during the last forty millisecond period when the RF signal is not modulated.

The dc voltages which thus appear across the capacitors 56 and 58 are coupled to the ratio detector 46 whose output is a pulse width modulated voltage having a duty cycle proportional to the ratio of the voltage on capacitor 56 ($V_{S+N}$) to the voltage on capacitor 58 ($V_N$).

Consequently, with the instrument connected to the receiver as described hereinbefore, the operator merely adjusts the attentuator 24 until the meter 50 has a reading of ten dB. The dial 26 then shows the sensitivity of the receiver.

While the present invention has been described in connection with a particular embodiment thereof, it will be understood by those skilled in the art that many changes and modifications may be made without departing from the true spirit and scope of the present invention. Therefore, it is intended by the appended claims to cover all such changes and modifications which come within the true spirit and scope of this invention.

What is claimed:

1. An instrument for use in measuring the sensitivity of a radio receiver comprising
   a radio frequency generator providing a radio frequency carrier,
   an audio frequency generator providing a constant frequency audio signal,
   modulator means for modulating said radio frequency carrier with an audio signal applied thereto,
   means for sequentially applying said audio signal to said modulator means,
   means coupling the output signal from said modulator means to the radio frequency input of said receiver,
   detecting means for providing a dc output voltage proportional to the level of an audio frequency signal applied thereto,
   means coupling the audio output signal from said receiver to said detecting means,
   first and second signal storage devices,
   switching means coupling the output of said detecting means to said first signal storage device only during the period when said audio signal is applied to said modulator means and coupling the output of said detecting means to said second signal storage device only during the period when said audio signal is not applied to said modulator means,
   means responsive to the signals stored by said storage devices for displaying the ratio of the signals respectively stored by first and second signal storage devices,
   means for adjusting the level of the output signal from said modulator means applied to said RF input to set said ratio at a predetermined value,
   ramp wave generating means for providing a ramp wave having a slope proportional to the value of said signal stored by said first storage device,
   means for displaying the level of said output signal applied to said RF input,
   said means for displaying the ratio comprising,
   means for developing a dc voltage signal when the voltage level of said ramp wave is greater than the voltage level of said signal stored by said second storage device,
   means for periodically resetting said ramp wave generating means at a rate sufficient to prevent the voltage of said ramp wave from exceeding the voltage stored by said first storage device,
   meter means for displaying the average value of a variable dc voltage applied thereto, and
   means coupling said dc voltage signal to said meter means.

2. An instrument as set forth in claim 1 wherein said means for developing a dc voltage signal comprises
   an operational amplifier connected in the differential mode,
   said ramp wave being connected to one input of said amplifier, and
   the voltage stored by said second storage device being connected to the other input of said amplifier.

* * * * *